(12) United States Patent
Cher et al.

(10) Patent No.: US 10,746,785 B2
(45) Date of Patent: Aug. 18, 2020

(54) DYNAMIC PREDICTOR OF SEMICONDUCTOR LIFETIME LIMITS

(71) Applicant: INTERNATIONAL BUSINESS MACHINES CORPORATION, Armonk, NY (US)

(72) Inventors: Chen-Yong Cher, Port Chester, NY (US); Keith A. Jenkins, Sleepy Hollow, NY (US); Barry P. Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 477 days.

(21) Appl. No.: 15/230,067

(22) Filed: Aug. 5, 2016

(65) Prior Publication Data
US 2018/0038906 A1 Feb. 8, 2018

(51) Int. Cl.
*G01R 31/28* (2006.01)

(52) U.S. Cl.
CPC ..... *G01R 31/2849* (2013.01); *G01R 31/2837* (2013.01)

(58) Field of Classification Search
None
See application file for complete search history.

(56) References Cited

U.S. PATENT DOCUMENTS

| | | | |
|---|---|---|---|
| 6,597,193 B2 | 7/2003 | Lagowski et al. | |
| 6,882,172 B1 | 4/2005 | Suzuki et al. | |
| 6,900,690 B2 | 5/2005 | Kang et al. | |
| 7,149,674 B1 | 12/2006 | Sirichotiyakul et al. | |
| 7,592,876 B2 * | 9/2009 | Newman | G01R 31/2856 324/762.09 |
| 8,274,301 B2 | 9/2012 | Feng et al. | |
| 8,736,314 B2 | 5/2014 | Kim | |
| 8,942,932 B2 | 1/2015 | Naffziger | |
| 9,310,424 B2 | 4/2016 | Allen-Ware et al. | |
| 9,513,329 B2 | 12/2016 | Potkonjak | |
| 2009/0013207 A1 | 1/2009 | Bose et al. | |
| 2012/0053897 A1 | 3/2012 | Naffziger | |

(Continued)

OTHER PUBLICATIONS

J. Keane et al., "An All-in-One Silicon Odometer for Separately Monitoring HCI, BTI, and TDDB," IEEE Journal of Solid-State Circuits, vol. 45, No. 4, 2010, pp. 817-829.

(Continued)

*Primary Examiner* — Douglas X Rodriguez
(74) *Attorney, Agent, or Firm* — Intelletek Law Group, PLLC; Gabriel Daniel, Esq.

(57) ABSTRACT

A method and circuit of monitoring an effective age of a target circuit are provided. A standby mode is activated in the target circuit. A standby current of a first number of circuit blocks of the target circuit is measured. The measured standby current of the first number of circuit blocks is compared to a first baseline standby current of the first number of circuit blocks. Upon determining that the measured standby current of the first number of circuit blocks is below a first predetermined factor of a baseline standby current of the first number of circuit blocks, the first number of circuit blocks is identified to have a bias temperature instability (BTI) degradation concern.

20 Claims, 7 Drawing Sheets

(56) References Cited

U.S. PATENT DOCUMENTS

2015/0061707 A1* 3/2015 Balasubramanian .......................
 G01R 31/31725
 324/750.01
2016/0069950 A1* 3/2016 Chen .................. G01R 31/2855
 324/750.05

OTHER PUBLICATIONS

P.-F. Lu and K. A. Jenkins, "A Built-In BTI Monitor for Long-Term Data Collection in IBM Microprocessors," International Reliability Physics Symposium, IRPS, 2013, 4A, 6 pages.
S-W. Chen et al., "Fully On-Chip Temperature, Process, and Voltage Sensors," ISCAS, 2010, pp. 897-900.
T. Matsuda et al., "Reliability Analysis of NAND Gates with Modified Channel Length in Series n-MOSFETs," International Conference on Microelectronic Test Structures, ICMTS, 2012, 4 pages.

* cited by examiner

DYNAMIC PREDICTOR OF SEMICONDUCTOR LIFETIME LIMITS

STATEMENT REGARDING FEDERALLY SPONSORED RESEARCH OR DEVELOPMENT

This application has been written with Government support under Contract No.: HR0011-13-C-0022 (Defense Advanced Research Projects Agency (DARPA)). The Government has certain rights in this invention.

BACKGROUND

Technical Field

The present disclosure generally relates to semiconductor devices, and more particularly, to determining the effective age of a semiconductor circuit.

Description of the Related Art

The lifetime of a semiconductor circuit varies due to various environmental factors. As a semiconductor circuit ages, the performance of the transistors degrades, which ultimately may render the semiconductor circuit to be unreliable. The semiconductor circuit ages because its transistors are exposed to different operational conditions, such as current, voltage, temperature, etc. The cumulative effects of such stress reduce the effective age of the semiconductor circuit.

One such aging effect is time-dependent dielectric breakdown (TDDB), which is a failure mechanism in a metal oxide semiconductor field effect transistor (MOSFET), where the gate oxide breaks down due to the build-up of defects in the dielectric over time. For example, the breakdown is caused by a formation of a conducting path through the gate oxide to the device channel due to the electron tunneling current.

Another aging effect is bias-temperature instability (BTI), which manifest itself as an increase in the threshold voltage of a transistor. BTI is an electrochemical reaction that relates to electric field, holes, silicon-hydrogen bonds, and temperature. For example, during operation of a semiconductor circuit, interface traps are introduced between the gate oxide and the channel of its transistors. Over time, these interface traps increase, thereby shifting the threshold voltage of the transistors. Consequently, the drain current and the transconductance of a transistor (e.g., MOSFET) is reduced.

Yet another aging effect is related to hot carrier injection (HCI), which has an effect similar to BTI. HCI may be caused by currents flowing in the devices, causing defects or charge in the oxide. Like BTI, HCI increases the device threshold voltage, which slows down the switching and decreases the standby current. In addition to reducing drain current and transconductance, the increase of threshold voltage results in a decrease of off-state current in single devices, or standby current in circuits. Due to the similarity between BTI and HCI, both aging effects are referred to herein as BTI for simplicity.

Accordingly, due to the various reliability concerns, the lifetime of a semiconductor circuit may vary, thereby complicating the determination of the effective age of a semiconductor circuit. It is with respect to these considerations and others that the present disclosure has been written.

SUMMARY

According to an embodiment of the present disclosure, a method of monitoring an effective age of a target circuit is provided. A standby mode is activated in the target circuit. A standby current of a first number of circuit blocks of the target circuit is measured. The measured standby current of the first number of circuit blocks is compared to a first baseline standby current of the first number of circuit blocks. Upon determining that the measured standby current of the first number of circuit blocks is below a first predetermined factor of a baseline standby current of the first number of circuit blocks, the first number of circuit blocks is identified to have a BTI degradation concern.

In one embodiment, a standby current of a second number of circuit blocks of the target circuit is measured and compared to a second baseline standby current of the second number of circuit blocks. Upon determining that the measured standby current of the second number or circuit blocks is above a second predetermined factor of the second baseline standby current, the second number of circuit blocks is identified to have a TDDB degradation concern.

In one embodiment, a noise of the standby current of the second number of circuit blocks is measured. Upon determining that the measured noise of the standby current of the second number or circuit blocks is above a predetermined threshold, the second number of circuit blocks is identified to have a TDDB degradation concern.

According to another embodiment of the present disclosure, a method of monitoring an effective age of a target circuit is provided. A standby mode is activated in the target circuit. A standby current of a second number of circuit blocks of the target circuit is measured. The measured standby current of the second number of circuit blocks is compared to a second baseline standby current of the second number of circuit blocks. A noise of the standby current of the second number of circuit blocks is measured. Upon determining that at least one of: (i) the measured standby current of the second number of circuit blocks is above a second predetermined factor of the second baseline standby current, wherein the second predetermined factor is >1, and (ii) the measured noise of the standby current of the second number or circuit blocks is above a predetermined threshold, identifying the second number of circuit blocks to have a TDDB degradation concern.

According to another embodiment of the present disclosure, an age monitor circuit is provided. The age monitor circuit comprises a controller circuit coupled to a target circuit and configured to activate a standby mode in the target circuit. There is a test circuit coupled to the controller circuit. There is a register circuit coupled to the test circuit. There is a predictor circuit coupled to the register circuit. The controller is configured to activate a standby mode in the target circuit and select a first number of circuit blocks of the target circuit. The test circuit is configured to measure a standby current of the first number of circuit blocks and store the measured standby current in the register circuit. The predictor circuit is configured to compare the measured standby current of the first number of circuit blocks to a first baseline standby current of the first number of circuit blocks provided by the register circuit, and upon determining that the measured standby current of the first number of circuit blocks is below a first predetermined factor (which is <1) of a baseline standby current of the first number of circuit blocks, identify the first number of circuit blocks to have a BTI degradation concern; and In one embodiment, the test circuit is further configured to measure a standby current of a second number of circuit blocks of the target circuit and measure a noise of the standby current of the second number of circuit blocks. The predictor circuit is further configured to compare the measured standby current of the second number of circuit blocks to a second baseline standby current of the second number of circuit blocks provided by the register circuit and upon determining that at least one of: (i) the measured standby current of the second number of circuit blocks is above a second predetermined factor of the second baseline standby current, wherein the second predetermined factor is >1, and (ii) the measured noise of the standby current of the second number or circuit blocks is above a predetermined threshold, identifying the second number of circuit blocks to have a TDDB degradation concern.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to semiconductor devices, and more particularly, to determining the age of a semiconductor circuit. According to various embodiments disclosed herein, the age of a target semiconductor circuit may be monitored by measuring parameters of the target circuit itself. Upon determining that one or more thresholds are exceeded the system discussed herein identifies whether there is a BTI or TDDB degradation concern. In some embodiments, upon identifying the effective age of the target circuit, corrective action is taken to provide various notifications and/or to impose or remove restrictions on the circuit such that it is operated more appropriately for its identified effective age. By virtue of performing the degradation tests on the actual target circuit blocks (e.g., instead of a proxy), the effective age of the target circuit blocks can be accurately determined. Reference now is made in detail to the examples illustrated in the accompanying drawings and discussed below.

Example Architecture

Figure 1:
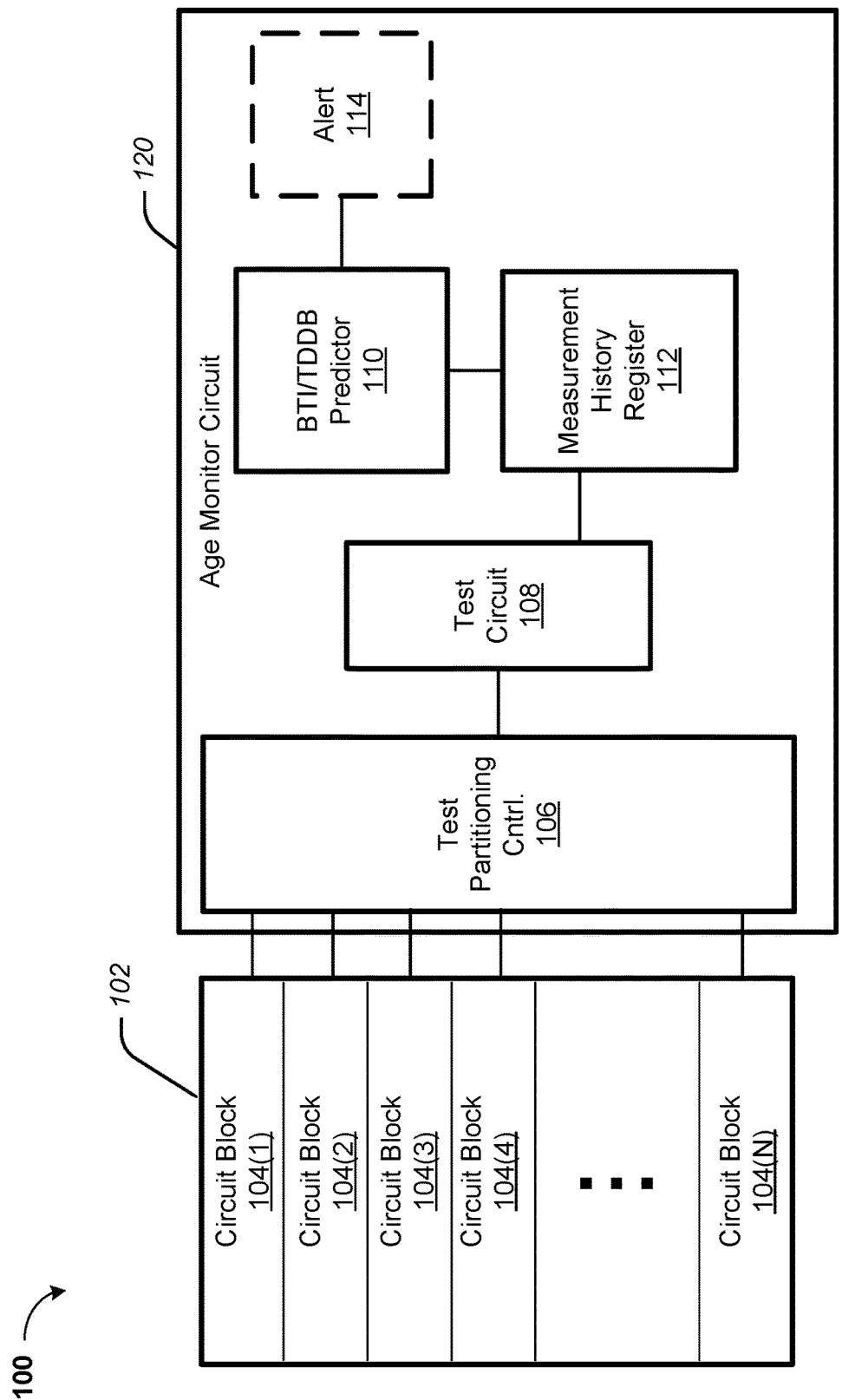
FIG. 1 is a block diagram of a system that can monitor the age of a target circuit, consistent with an exemplary embodiment.

FIG. 1 is a block diagram of a system 100 that can monitor the age of a target circuit, consistent with an exemplary embodiment. System 100 includes an age monitor circuit 120 and a target circuit 102. The age monitor circuit 120 comprises a test partitioning controller 106, a test circuit 108, a measurement history register 112, and a predictor block 110. In one embodiment, there is an alert/adjustment block 114.

The target circuit 102 may be a semiconductor circuit that may include, without limitation, various components, such as transistors, resistors, capacitors, inductors, and diodes that may be coupled by conductive wires or traces, through which electric current can flow. The combination of components and wires allows various functions to be implemented, such as logic, memory, microprocessor, and other known electronic circuits. In various scenarios, the target circuit 102 may be analog, digital, or a combination thereof (e.g., mixed signal).

The target circuit 102 may operate in normal mode, where it performs its intended function, and a standby mode, where it no longer processes data. As used herein, "standby" refers to a state where one or more circuit blocks is/are in a non-switching mode. For example, the system clock is turned OFF (e.g., for a digital circuit) and/or the input of data and the output of data is prohibited (e.g., for an analog circuit). Such state may be induced by the age monitor circuit 120.

The target circuit 102 may be partitioned into several blocks, as represented by blocks 104(1) to 104(N). Accordingly, the partitioning need not be based on a functional or circuit logic level; rather, the partitioning into circuit blocks may be based on current consumption considerations. Put differently, a circuit block may be limited to a maximum standby current in relation to a desired current measurement sensitivity. In one embodiment, each circuit block consumes a substantially similar amount of current during standby mode.

For example, to measure a delta of 1 uA of standby current for a circuit block, the measurement is more accurate if the circuit block only consumes 10 uA of standby current instead of 0.1 A, where the current measurement would be rendered less reliable due to the standby current noise. To that end, in one embodiment, the blocks are partitioned such that the standby current consumption has a factor of 10:1 to 100:1 of the desired current measurement sensitivity. If the number of circuit blocks is above the desired resolution, then multiple (e.g., two to all) circuit blocks may be measured simultaneously by the age monitor circuit 120. It will be understood that the resolution (e.g., the desired sensitivity of the standby current measurement) may depend on various factors, such as the function of the circuit block, the materials used in the circuit 102, the operating conditions, and the like.

The test partitioning controller 106 of the age monitor circuit 120 is configured to provide a path between the corresponding one or more circuit blocks 104(1) to 104(N) to the test circuit 108. For different tests, the partitioning controller 106 may select different a number of circuit blocks to be tested simultaneously by the test circuit 108. For example, fewer circuit blocks may be selected by the test partitioning controller 106 for a TDDB standby current measurement, because a higher resolution (e.g., 1 uA) provides more accurate results. In contrast, several or all circuit blocks 104(1) to 104(N) may be selected by the partitioning controller 106 for a BTI measurement, because a lower sensitivity is sufficient to provide reliable results. The criteria and resolution used for the BTI and TDDB measurements are discussed in more detail in a later section.

The test circuit block 108 of the age monitor circuit 120 is configured to perform one or more tests on the one or more circuit blocks 104(1) to 104(N). For example, the test circuit 108 may measure a standby current and/or a noise level of the standby current periodically. These measured values may be stored in a measurement history register 112.

The predictor block 110 of the age monitor circuit 120 is configured to determine an effective age of the chip 102. To that end, in various embodiments, the predictor block 110 may compare the latest measured standby current to a baseline standby current for the corresponding circuit block. Based on this comparison, the predictor block 110 may identify whether there is a BTI and/or TDDB degradation concern. The predictor block 110 may compare a latest noise measurement of the standby current to a baseline standby noise for the corresponding circuit block to determine whether there is a TDDB degradation concern. Further, the predictor block 110 may identify a signature (of the standby current and/or noise) of one or more circuit blocks by analyzing the trends and patters of the measurements from the measurement history register and compare the signature to a stored simulated aging model of the corresponding circuit block (which may be retrieved from the measurement history register 112), to adjust the aging model and/or predict the age of the corresponding circuit block of the target circuit 102.

In one embodiment, the original aging model may be created for one or more circuit blocks by an appropriate circuit simulation program. For example, a circuit block, such as circuit block 104(1), may be simulated to identify effects of aging (e.g., with respect to BTI and TDDB). In one embodiment, a similar circuit block is physically exposed to an increasing supply voltage to emulate the effects of aging for that circuit block, to create a model of the degradation of the circuit block 104(1) over time. In one embodiment, there may be a different model for different aging effects (e.g., BTI and TDDB). In various embodiments, these models may be stored in a memory of the chip that includes the target circuit 102, such as the measurement history register 112, and/or a microcontroller of the chip. An example graph of a model for degradation is discussed in a later section.

The predictor block 110 may compare the measured standby current and/or noise data to the simulated aging model to determine the effective age of the corresponding circuit block. For example, upon determining that after a predetermined number of measurements over time that the standby current is above or below a predetermined threshold or the noise level is above a predetermined threshold, the predictor block 110 may conclude that there is a BTI and/or TDDB degradation concern.

In one embodiment, there is an alert block 114 configured to take action upon a trigger event. As used herein, a trigger event is when the predictor block 110 identifies there to be a BTI and/or a TDDB degradation concern or when the predictor block 110 identifies that the target circuit 102 (or the circuit blocks thereof) are not aging according to a predetermined simulation model. In this regard, the alert block 114 may provide various alert signals and/or corrective actions. For example, when a BTI degradation concern is identified, a first signal may be activated, and when a TDDB degradation concern is identified, a second signal may be activated. In one embodiment, these signals are communicated to other components of the chip that includes the target 102. These signals indicate that the corresponding circuit block has aged due to BTI and/or TDDB and may therefore no longer be dependable. In one embodiment, the alert block 114 may trigger corrective action on the target circuit 102 by adjusting various parameters, such as maximum frequency, voltage, etc.

Figure 2:
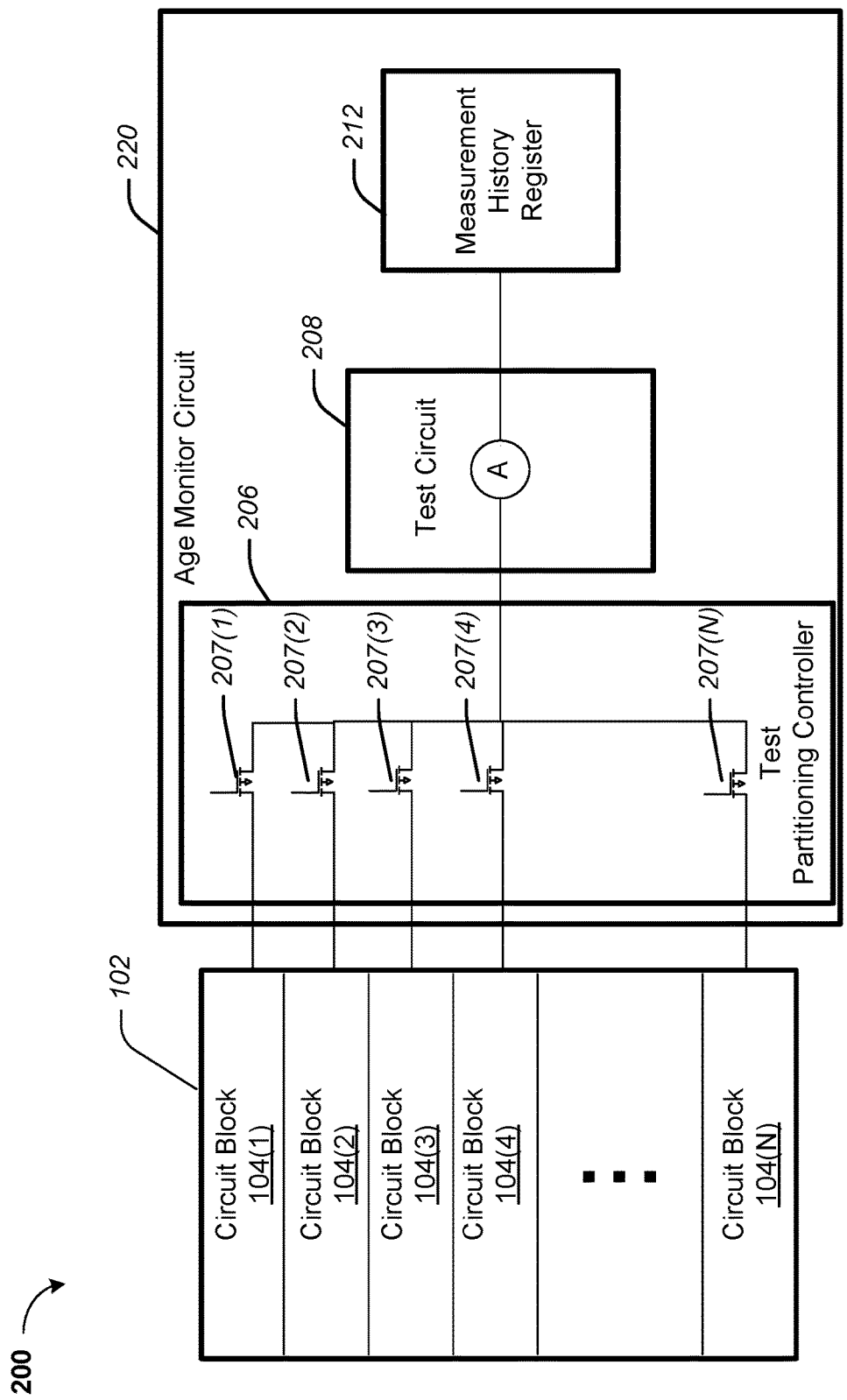
FIG. 2 illustrates a more detailed view of some of the components of the age monitor circuit of FIG. 1, consistent with an exemplary embodiment.

Reference now is made to FIG. 2, which illustrates a more detailed view of some of the components of the age monitor circuit of FIG. 1. The test partitioning controller 206 of the age monitor circuit 220 includes several circuits (e.g., 207(1) to 207(N)) that are configured to enable a path between one or more circuit blocks (e.g., 104(1) to 104(N)) to the test circuit 208. For example, each circuit block (e.g., 104(1) to 104(N)) may have a corresponding switch (e.g., 207(1) to 207(N)) that creates a path between the circuit block and the test circuit 208. In various embodiments, each switch of the test partitioning controller 206 may include one or more transistors. For example, circuit 207(1) may be a negative channel field effect transistor (NFET), a positive channel field effect transistor (PFET), or a combination thereof to implement a complementary metal oxide semiconductor (CMOS) transmission gate. Accordingly, while a single PFET is illustrated by way illustrative example for each circuit of the test partitioning controller 206 to implement a switch, it will be understood that other known configurations are possible as well, such as a single NFET, a CMOS transmission gate, or by using bipolar logic gates and/or junction field effect transistors JFETS.

As discussed previously, the test partitioning controller may select one or more circuit blocks (e.g., 104(1) to 104(N)) such that the standby current of the target circuit block (or blocks) is measured by the test circuit 208. The number of circuit blocks selected simultaneously may be based on the desired current and/or noise measurement sensitivity. In one embodiment, the number of circuit blocks selected simultaneously for a standby current measurement by the test circuit is based on a factor of at most 100:1 (and preferably 10:1) of the desired current measurement sensitivity.

In one embodiment (not shown), each circuit block (e.g., 104(1) to 104(N)) includes its own test circuit 208. Alternatively, there may be a test circuit 208 for several (but not all) circuit blocks (e.g., 104(1) to 104(3)). In this way, the test circuit may be placed closer to its corresponding circuit block(s) such that routing and measurement quality is improved. Put differently, a single test circuit 208 need not be shared by all circuit blocks 104(1) to 104(N).

The test circuit block 208 of the age monitor circuit 220 is configured to perform one or more tests on the one or more circuit blocks 104(1) to 104(N). For example, the test circuit 208 may measure a standby current and/or a noise level of the standby current. It is believed that those skilled in the art are familiar with such test circuit structures and they are therefore not discussed here in substantial detail for brevity. These measured values may be stored in a measurement history register 212. In various embodiments, the measurement history register 212 may be a standalone memory buffer or a memory that is associated with a microcontroller on the chip of the target circuit 102.

Example Graphs

Figure 3A:
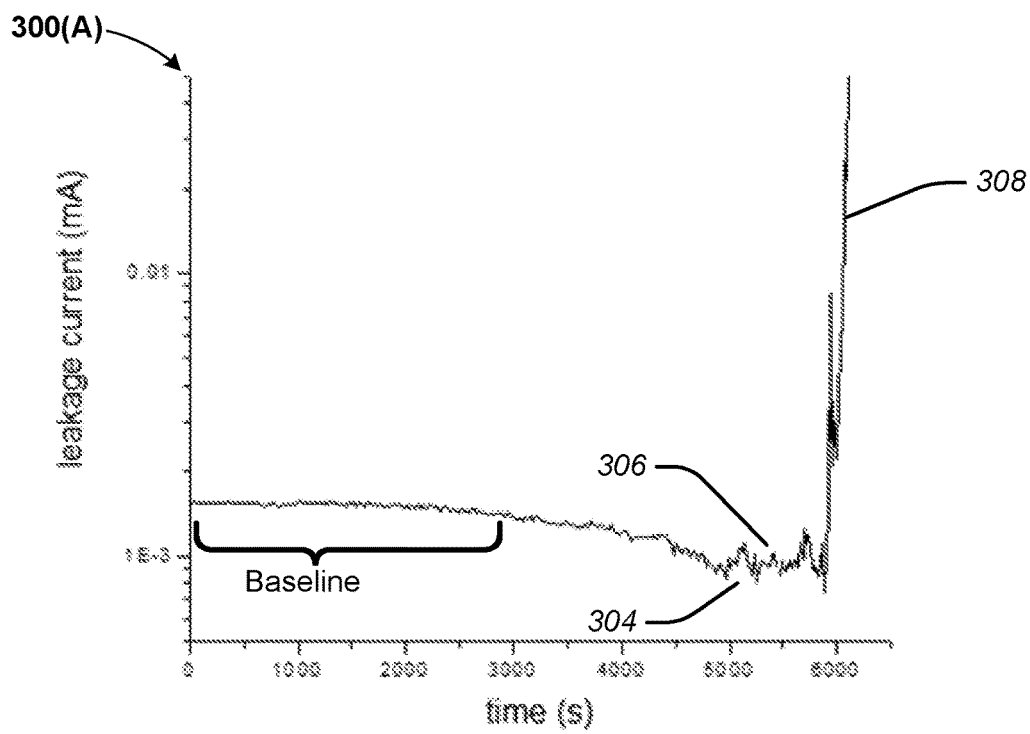
FIG. 3A illustrates an example graph of standby current versus time.
Figure 3B:
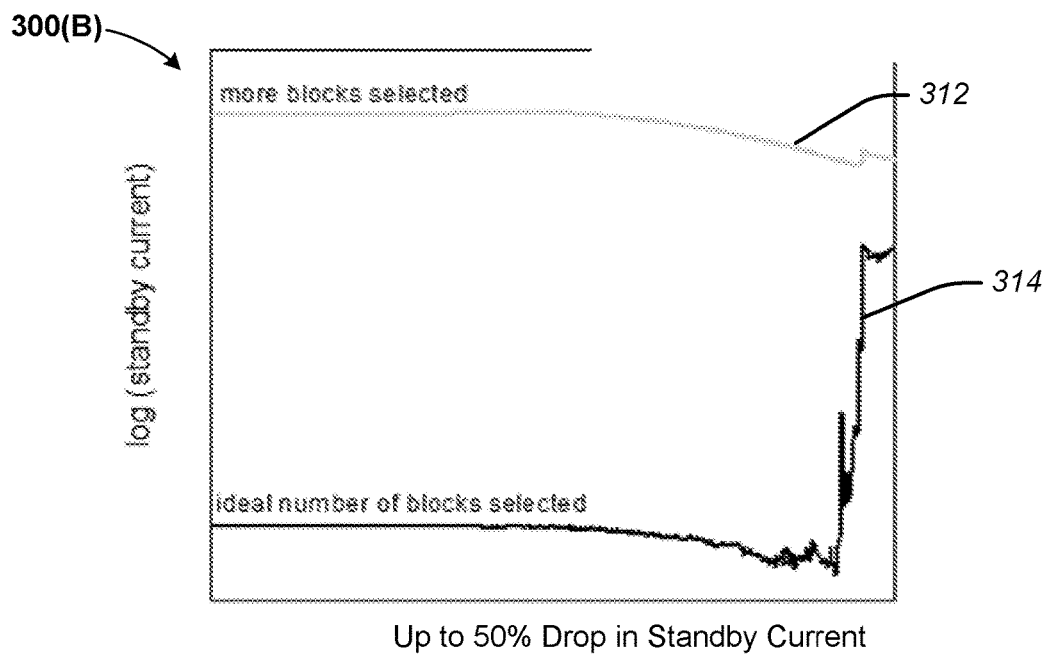
FIG. 3B illustrates example graphs of standby current versus time for different selected circuit blocks.

The identification of the effects of BTI and TDDB may be better understood in view of some graphs. To that end, FIGS. 3A and 3B illustrate a graph of standby current of various circuit blocks as a target circuit degrades. More particularly, FIG. 3A illustrates an example graph of standby current versus time and FIG. 3B illustrates example graphs of standby current versus time for different selected circuit blocks. In various embodiments, the graphs of 3A and 3B may be generated by physical measurements of a circuit block or by computer simulation thereof.

Graph 300(A) indicates that the standby current, sometimes referred to herein as leakage current, is relatively stable over a long time range. This standby current decreases with aging for a circuit block due to the effects of BTI, as indicated by position 304. In some semiconductor circuits, such decrease may be up to 50% with respect to the stable range (e.g., up to 1.4V), based on the increase of threshold voltage of the transistors in the circuit.

Accordingly, a decrease in standby current above a predetermined factor (e.g., percentage) as compared to the standby current during stable operation (i.e., baseline portion), is indicative that the target circuit block is suffering the aging consequences of BTI. For example, a decrease in standby current by a factor of 0.4 (i.e., 40%) as compared to the baseline current value, is a trigger event to identify the circuit block to have degraded due to BTI. For a BTI degradation current measurement, several (e.g., or all) circuit blocks may be measured simultaneously to save time and computing resources.

As to the degradation of the circuit block due to the effects of TDDB, its signature is a sharp increase in standby current, as indicated by position 308 in graph 300(A). The current increases sharply because the gate oxide of the transistors of the circuit has been damaged and there is a tunneling current from the gate to the drain, source, and/or substrate of the transistor. For a TDDB degradation current measurement, a higher current measurement resolution may be used to be able to quickly identify the degradation. To that end, fewer (e.g., a single circuit block) may be measured to provide adequate current measurement resolution. It should be noted that while the degradation effects of TDDB have been illustrated by way of example in FIGS. 3A and 3B to occur after BTI, in various scenarios, TDDB may occur before, after, or concurrently with BTI. Indeed, each failure mechanism is different, as explained previously.

FIG. 3B illustrates the measured standby current when more circuit blocks are selected (represented by curve 312) and when an ideal (e.g., fewer) number of circuit blocks are selected (represented by curve 314). When choosing the granularity of measurement, the selection of a number of blocks comes into consideration. BTI and TDDB have the opposite signatures of imminent failures: in BTI's case, a gradual decreasing standby current indicates aging; while in TDDB's case, the failure is preceded by a sharp increase in standby current. Because of the opposite signatures, measuring standby current of a fixed selection over time may not detect either of the failure types, because the opposite signatures may cancel out. Another salient opposite attribute of the two failures types is that TDDB tends to be random and isolated, whereas BTI is included to be clustered locally because nearby devices are subjected to similar usage and temperature. These two attributes lead to the selection strategies to be 1) measuring over multiple different selection combinations such that fewer blocks are selected (i.e., 314) for a TDDB measurement, without worrying that the TDDB increase in standby current may be offset by the decrease due to BTI; 2) measuring BTI with larger number of blocks selected (i.e., 312), which can observe BTI's signature of decreasing standby current, without worrying that a TDDB increase may offset the measurement.

In some scenarios, TDDB degradation in standby current is preceded by a phase where there is an increase in noise in the standby current, as indicated by position 306 in graph 300(A). For example, during the baseline phase, the standby current fluctuates within a predetermined range before noticeable aging effects (e.g., thereby creating a standby current level that remains stable during the baseline portion). However, after the baseline portion, the standby current fluctuates beyond the predetermined range due to the effects of TDDB degradation, as indicated by position 306. Accordingly, the following factors may be indicative that the target circuit block is suffering the aging consequences of TDDB: (i) an increase in the noise of the standby current above a predetermined noise range (e.g., threshold), and/or (ii) a sharp increase in standby current above a predetermined factor (e.g., percentage) as compared to the standby current during stable operation (i.e., baseline portion), It should be noted that a stress voltage (e.g., on the supply rails of the corresponding circuit block) can be used to emulate the effects of circuit degradation due to aging. To that end, a circuit block is aged by exposing it to an increasing voltage (e.g., the voltage supplied to the semiconductor circuit). Such accelerated stress testing via an increase in voltage is a corollary to the effects that time may have on a circuit block. Put differently, the degradation over voltage provides an effective model for degradation over time Example Processes With the foregoing overview of the systems 100 and 200 and example graphs 300(A) and 300(B), it may be helpful now to consider a high-level discussion of example processes. To that end, FIGS. 4 to 7 present illustrative processes 400 to 700 for various aspects of determining the age of a semiconductor device. Processes 400 to 700 are illustrated as a collection of blocks in logical flowcharts, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or performed in parallel to implement the process. For discussion purposes, the processes 400, 500, 600, and 700 are described with reference to system 100 of FIG. 1.

Figure 4:
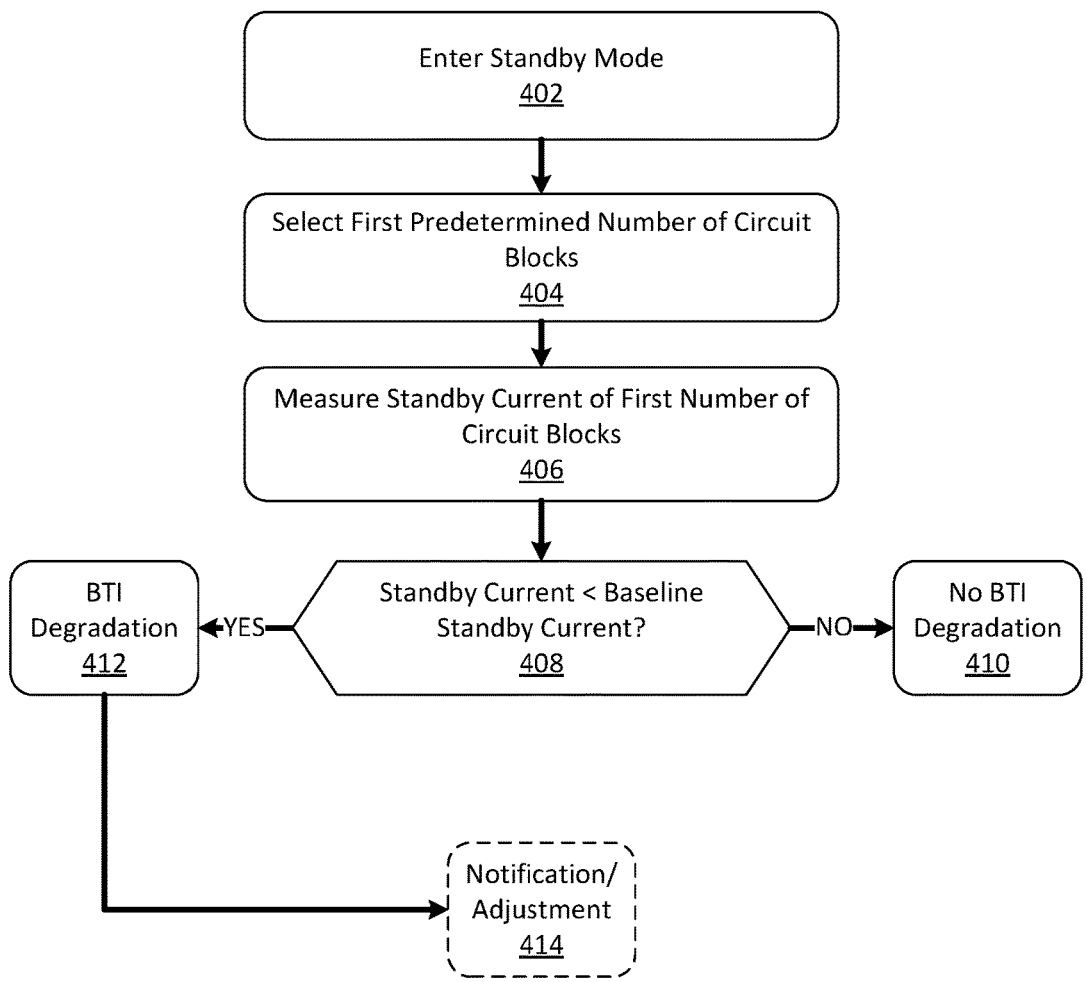
FIG. 4 describes an example process to determine whether there is a bias temperature instability (BTI) degradation concern.

FIG. 4 describes an example process to determine whether there is a BTI degradation concern. At block 402 the test partitioning controller 106 of the age monitor circuit 120 requests the circuit 102 to enter a standby mode. In various embodiments, all circuit blocks (e.g., 104(1) to 104(N)) may enter standby mode, or only the ones that are being tested by the age monitor circuit 120.

At block 404, the test partitioning controller 106 selects a first number of circuit blocks of the circuit. Put differently, the partitioning controller 106 provides a path between the first number of circuit blocks and the test circuit 108 of the age monitor circuit 120. In one embodiment, the number of circuit blocks selected is based on the desired current measurement sensitivity.

At block 406, the standby current of the first number of circuit blocks is measured. For example, the test circuit 108 determines how much standby current is consumed by the first number of circuit blocks. In one embodiment, this result is stored in a measurement history register 112.

At block 408 the measured standby current of the first number of circuit blocks is compared to a baseline standby current of the first number of circuit blocks. In one embodiment, the baseline standby current is (e.g., previously) determined by measuring the standby current at predetermined intervals for a predetermined period (i.e., the baseline phase). The baseline current does not vary beyond a predetermined tolerance (e.g., 5%). In another embodiment, the baseline standby current is determined via computer simulation by an external circuit simulator. The baseline current may be stored in the history register 112 to be used as a reference value.

Upon determining that the standby current is not below a predetermined threshold (e.g., baseline standby current) (i.e., "NO" at decision block 408), the process continues with block 410, where the age monitor circuit 120 deems the first number of circuit blocks to not have degraded of BTI.

Returning to block 408, upon determining that the standby current is below the predetermined threshold (e.g., baseline standby current) (i.e., "YES" at decision block 408), the process continues with block 412, where the age monitor circuit 120 deems the first number of circuit blocks to have degraded due to BTI.

In one optional embodiment, the determination that the first number of circuit blocks have degraded due to BTI is considered a trigger event. To that end, at block 414, additional action is performed by the age monitor circuit 120. For example, the alert block 114 may provide various signals and/or corrective actions, such as asserting a first signal, which may be communicated to other components of the chip that includes the target circuit 102, to indicate that the first number of circuit blocks of the target circuit 102 has aged due to BTI and may therefore no longer be dependable. In one embodiment, the alert block 114 may trigger corrective action on the target circuit 102 by adjusting various parameters, such as maximum frequency, voltage, etc.

Figure 5:
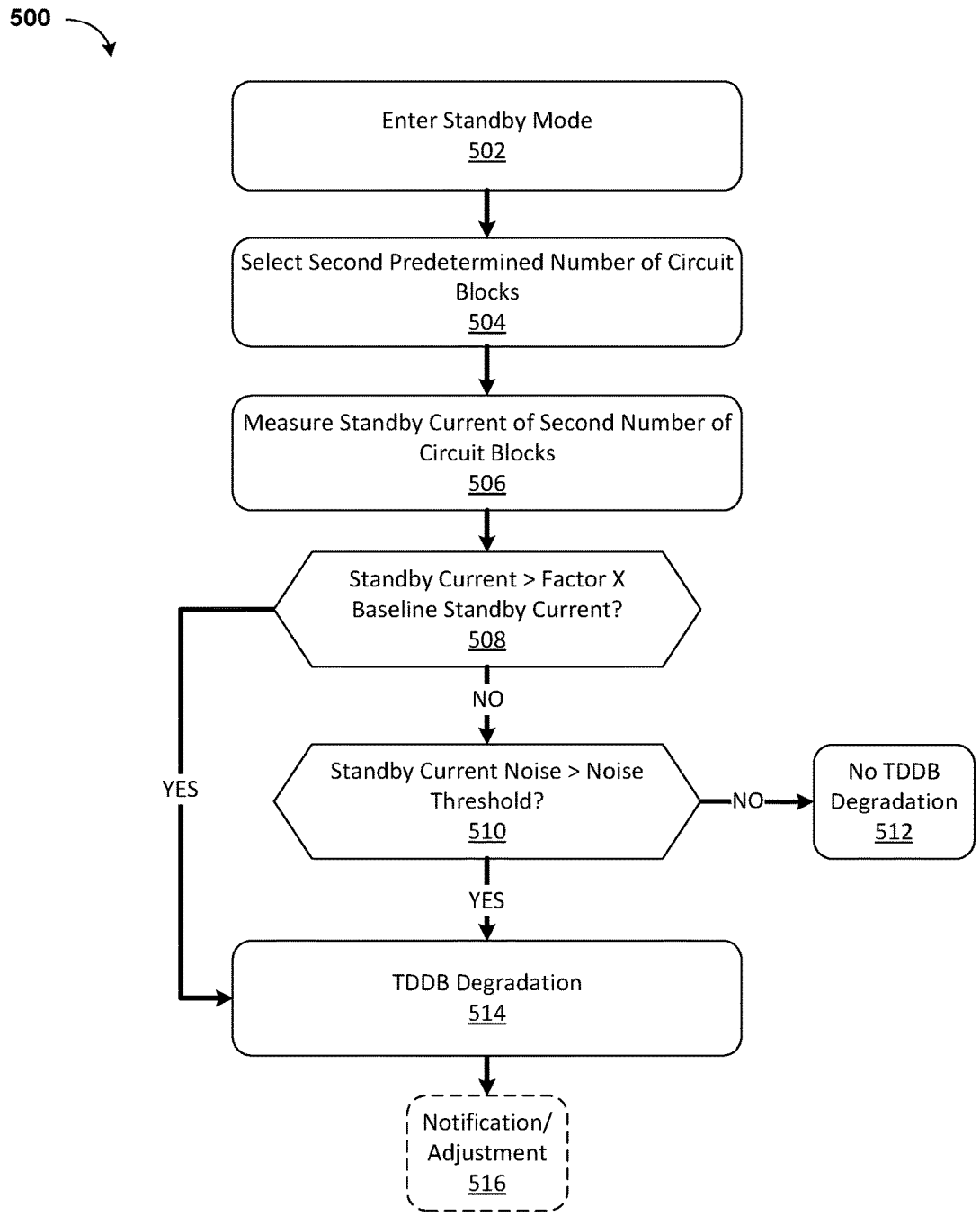
FIG. 5 describes an example process to determine whether there is a time-dependent dielectric breakdown (TDDB) degradation concern.

Reference now is made to FIG. 5, which describes an example process to determine whether there is a TDDB degradation concern for a target circuit. At block 502 the test partitioning controller 106 of the age monitor circuit 120 requests the target circuit 102 to enter a standby mode. In various embodiments, all circuit blocks (e.g., 104(1) to 104(N)) may enter standby mode, or only the ones that are being tested by the age monitor circuit 120.

At block 504, the test partitioning controller 106 selects a second number of circuit blocks of the circuit. Put differently, the partitioning controller 106 provides a path between the second number of circuit blocks and the test circuit 108 of the age monitor circuit 120. In one embodiment, the number of circuit blocks selected is based on the desired current measurement sensitivity. Accordingly, since the measurement sensitivity to identify a TDDB degradation involves a higher measurement sensitivity, the second number of circuit blocks may be fewer than the first number or circuit blocks that were used for process 400 that was used to identify a BTI degradation concern. Thus, in some scenarios, the second number of circuit blocks of the target circuit may be as few as one to provide the highest measurement sensitivity.

At block 506, the standby current of the second number of circuit blocks is measured. For example, the test circuit 108 determines how much standby current is consumed by the second number of circuit blocks. In one embodiment, this result is stored in the measurement history register 112.

At block 508 the measured standby current of the second number of circuit blocks is compared to the baseline standby current of the second number of circuit blocks. The determination of the baseline standby current was discussed in the context of the process 400 and is therefore not repeated here for brevity.

Upon determining that the standby current is above a factor of the baseline standby current (i.e., $I_{STANDBY}$>Factor X $I_{BASELINE}$) (i.e., "YES" at decision block 508), the process continues with block 514, where the age monitor circuit 120 deems the second number of circuit blocks to have degraded due to TDDB. The optional notification/adjustment block 516 is discussed later.

Returning to block 508, upon determining that the standby current is not above a factor of the baseline standby current (i.e., $I_{STANDBY} \leq$ Factor X $I_{BASELINE}$) (i.e., "NO" at decision block 508), the process continues with block 510, where the age monitor circuit 120 compares a presently measured standby current noise of the second number of circuit blocks to a baseline standby current noise. The presently measured standby current noise measurement may be for a recent predetermined period (e.g., the last 1 μsec). During the baseline phase, the standby current fluctuates within a predetermined range, sometimes referred to herein as a noise threshold. However, after the baseline portion, the standby current fluctuates beyond the predetermined range, and thus above the noise threshold, due to the effects of TDDB.

Upon determining that the standby current noise is not above the noise threshold (i.e., $I_{NOISE} \leq I_{NOISE\_THRESHOLD}$) (i.e., "NO" at decision block 510), the process continues with block 512, where the age monitor circuit 120 deems the second number of circuit blocks to not be subject to a TDDB degradation concern.

Upon determining that the standby current noise is above the noise threshold (i.e., $I_{NOISE} \geq I_{NOISE\_THRESHOLD}$) (i.e., "YES" at decision block 510), the process continues with block 514, where the age monitor circuit 120 deems the second number of circuit blocks to have a TDDB degradation concern.

In one optional embodiment, the determination that the second number of circuit blocks have degraded due to TDDB is considered a trigger event. To that end, at block 516, additional action is performed by the age monitor circuit 120. For example, the alert block 114 may provide various signals and/or corrective actions, such as asserting a second signal, which may be communicated to other components of the chip that includes the target circuit 102, to indicate that the second number of circuit blocks of the target circuit 102 has aged due to TDDB and may therefore no longer be dependable. In one embodiment, the alert block 114 may trigger corrective action by adjusting various parameters on the target circuit, such as maximum frequency, voltage, etc.

Figure 6:
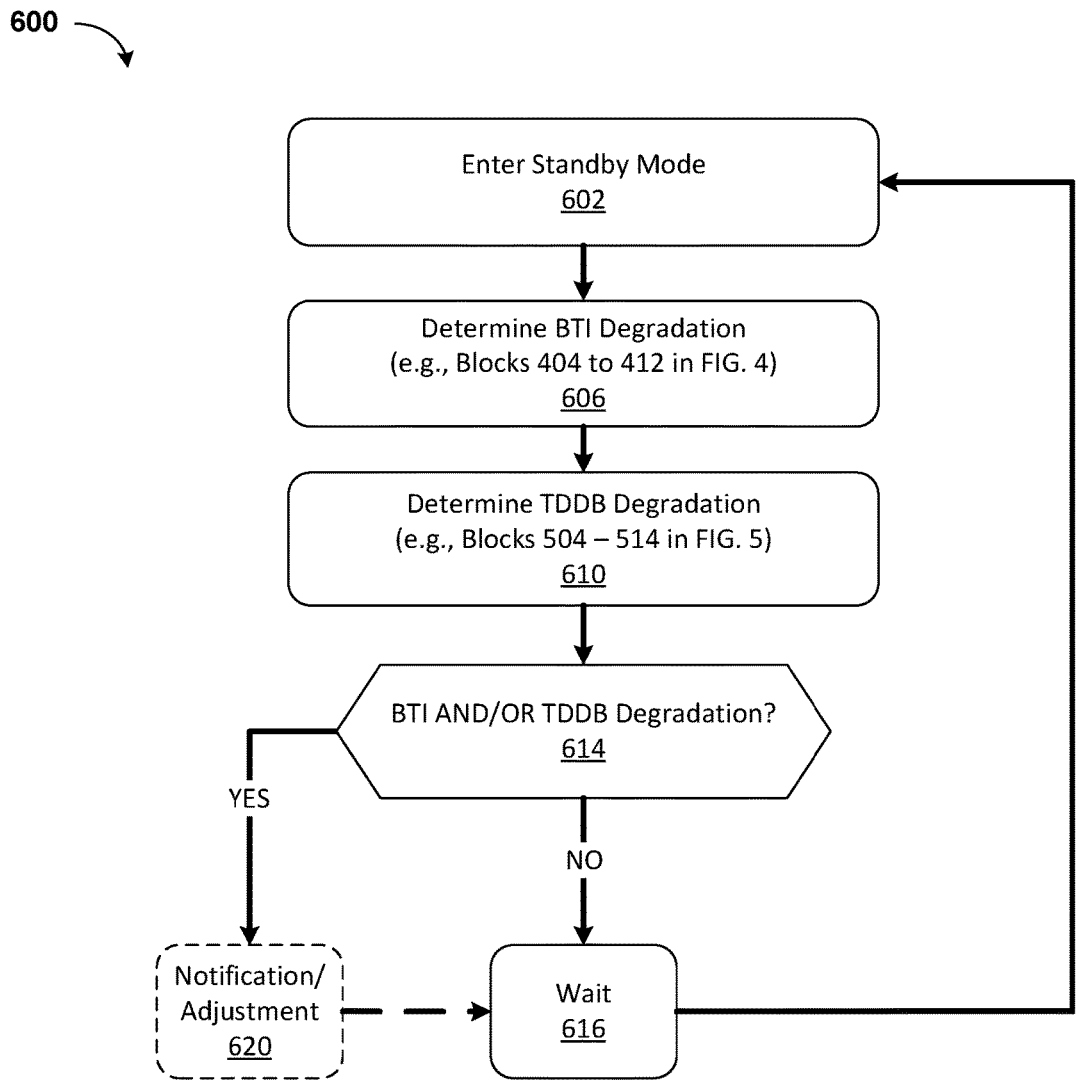
FIG. 6 illustrates an example process that performs both a BTI and a TDDB degradation determination.

In various embodiments, the process to determine whether there is a BTI degradation concern (e.g., process 400) and the process to determine whether there is a TDDB degradation concern (e.g., process 500) can be run independently, in series (in either order), or periodically based on a same or at different intervals between the BTI degradation determination and the TDDB degradation determination. To that end, FIG. 6 illustrates an example process that performs both a BTI degradation determination and a TDDB degradation determination. While the BTI degradation determination is illustrated by way of example to be performed before the TDDB degradation determination, the tests can be performed in either order. Further, these tests can be performed at a same period or at different periods. Put differently, multiple BTI tests may be performed before a TDDB test is performed (or the other way around).

In one embodiment, fewer circuit blocks of a target circuit 102 may be selected for a TDDB degradation test to provide a desired measurement accuracy, as compared to a BTI degradation test. In this regard, to cover all circuit blocks of the target circuit 102 for the TDDB degradation test, the number of tests performed for a TDDB degradation may depend on the desired measurement accuracy. Put differently, although only one TDDB degradation test is illustrated in process 600 in a cycle, many more TDDB degradation tests may be performed in process 600 in every cycle, such that all circuit blocks of a target circuit 102 are tested.

At block 602 the test partitioning controller 106 of the age monitor circuit 120 requests the target circuit 102 to enter a standby mode.

At block 606, the age monitor circuit 120 determines whether there is a BTI degradation concern. For example, blocks 404 to 412 in FIG. 4 are performed for a first predetermined number of circuit blocks. In one embodiment, the BTI degradation test is repeated for other circuit blocks of the target circuit 102 (e.g., until all circuit blocks have been evaluated). In one embodiment, the first predetermined number of circuit blocks includes the entire target circuit, thereby making additional BTI degradation tests unnecessary for the present cycle.

At block 610, the age monitor circuit 120 determines whether there is a TDDB degradation concern. For example, blocks 504 to 514 in FIG. 5 are performed for a second predetermined number of circuit blocks. The TDDB degradation test may be repeated for other circuit blocks of the target circuit 102 (e.g., until all circuit blocks have been evaluated for TDDB).

At block 614, the age monitor circuit 120 determines whether there is a BTI or TDDB degradation concern. If not, (i.e., "NO" at decision block 614), the process continues with block 616, where the cycle repeats after a predetermined wait period.

However, upon determining that there is a BTI or TDDB degradation concern, (i.e., "YES" at decision block 614), the process continues with block 620, where additional action is performed by the age monitor circuit 120. For example, the alert block 114 of the monitor circuit 120 may provide various signals and/or corrective actions, such as asserting a first signal to indicate that there is a BTI degradation concern, a second signal to indicate that there is a TDDB degradation concern, and/or adjusting various parameters, such as maximum frequency, voltage, etc., to prevent or slow down further degradation, accordingly. Depending on the severity of the degradation, the process may stop or continue after a waiting period (i.e., at block 616).

As discussed herein, the determination of an age of a target circuit block may involve a comparison to an aging model. Aging models were discussed previously in the context of FIGS. 3A and 3B. In various embodiments, an aging model may be developed via hardware measurements of similar one or more circuit blocks, either on the same chip as the target circuit block or on other semiconductor chip(s). Alternatively or in addition, the aging model (e.g., for each circuit block) may be provided by external simulation, as discussed previously. This individualized model may be added to the chip firmware and/or board carrying the chip. In some embodiments, the aging model is stored in the measurement history register 112 of the age monitor circuit 120.

In various embodiments, this aging model may provide a lookup table, one or more thresholds over time, and/or an equation that characterizes the predicted aging of the target circuit block for one or more failure mechanisms, such as BTI and TDDB degradation. The granularity of the aging model may be at target circuit level and/or at the same resolution as the number of blocks that are selected by the test partitioning controller 106, thereby providing a reference for physical measurements performed by the test circuit 108 of the age monitor circuit 120.

In one embodiment, this aging model may be updated by the age monitor circuit 120. Such updates may be performed at predetermined intervals or upon a trigger event (e.g., leakage currents being above or below predetermined thresholds or the noise floor increasing for the standby current measurement, as discussed herein). For example, some circuit blocks may be operated under more optimal conditions (e.g., cooler temperature, low humidity, shielded from radiation, lower voltage, etc.). In this regard, the circuit block does not degrade as readily as one that is operated in a harsher environment. To provide an accurate effective age, the aging model may be adjusted accordingly. In this way, a more accurate "end of life" of a circuit block can be accessed. The update of the aging model is discussed in more detail below.

Figure 7:
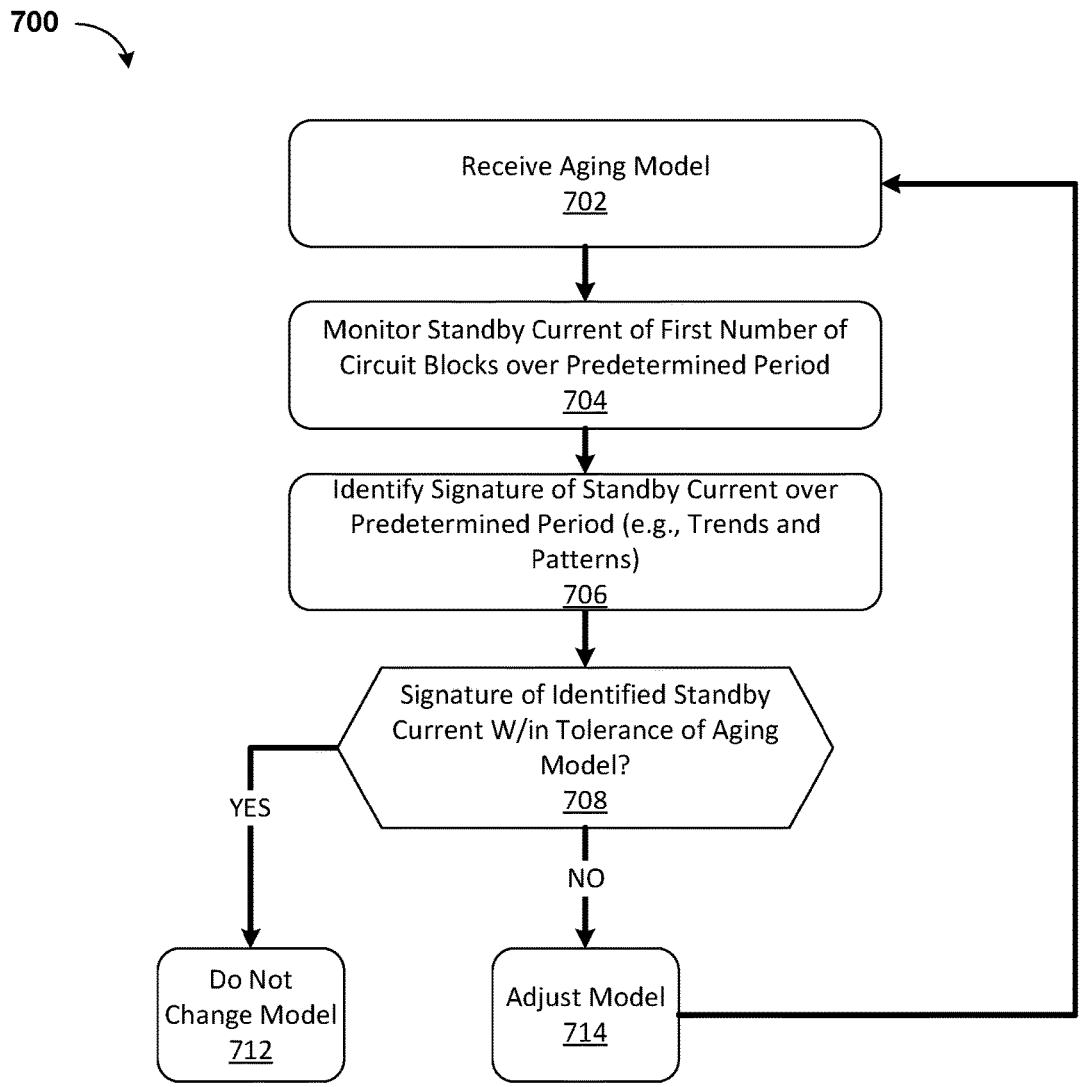
FIG. 7 illustrates an example process to identify an age of a circuit block having an aging model.

FIG. 7 illustrates an example process to identify an age of a circuit block that has an aging model. At block 702 an aging model is received by the age monitor circuit 120. This aging model may be stored in a measurement history register 112 of the age monitor circuit 120. This aging model provides a reference signature of expected degradation that can be used as a comparison to identify an effective age of the target circuit block.

At block 704, the standby current of the first number of circuit blocks is monitored over a predetermined period. For example, each measurement of the standby current is stored in the measurement history register 112.

At block 706, after a predetermined number of measurements are made over time (e.g., at predetermined intervals), a signature of the standby current and/or noise is identified for a predetermined period. For example, the signature of the standby current (e.g., for both amplitude and noise) is identified for the first number of circuit blocks by analyzing the trends and patters of the measurements of the standby current provided by the measurement history register 112.

At block 708, a determination is made by the age monitor circuit 120 whether the signature of the identified standby current is within tolerance of the aging model for the first number of circuit blocks.

After a predetermined number of measurements, it is determined whether the chip is on track with respect to the aging model. To that end, at least one of the following is determined: (i) whether the standby current is above a first predetermined threshold deviation from the aging model; (ii) whether the standby current is below a second predetermined threshold deviation from the aging model; (iii) whether the measured noise is above a predetermined threshold from the aging model. If none of the thresholds are exceeded (i.e., "YES" at decision block 708), then at block 712, the age monitor circuit 120 makes no changes to the aging model.

However, upon determining that one or more thresholds are exceeded (i.e., "NO" at decision block 708), then at block 714 one or more adjustments to the aging model are made. In some embodiments, some restrictions to the circuit block are introduced or removed to prevent a premature failure of the circuit block. For example, if the circuit block is identified to be degrading prematurely, then additional restrictions may be imposed, such as a reduction of operating frequency, lowering the supply voltage, activating an external fan, and the like. Alternatively, upon determining that the circuit block is showing little degradation, certain barriers of operation may be removed such that the circuit block can be operated in a more aggressive manner (e.g., higher voltage, higher frequency, etc.). The process may then repeat at a predetermined interval.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

Aspects of the present disclosure are described herein with reference to flowchart illustrations and/or block diagrams of methods, apparatus (systems), and computer program products according to embodiments of the application. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method of monitoring an effective age of a target circuit by a monitor circuit, the method comprising:
    activating a standby mode in the target circuit;
    measuring a standby current of a first number of circuit blocks of the target circuit by the monitor circuit;
    comparing the measured standby current of the first number of circuit blocks to a first baseline standby current of the first number of circuit blocks; and
    upon determining that the measured standby current of the first number of circuit blocks is below a first predetermined factor of the first baseline standby current of the first number of circuit blocks, identifying the first number of circuit blocks to have a bias temperature instability (BTI) degradation concern, wherein the first predetermined factor is <1,
    wherein a number of circuit blocks that are included in the first number of circuit blocks is based on a predetermined current measurement sensitivity.

2. The method of claim 1, wherein the standby mode is activated in the first number of circuit blocks of the target circuit.

3. The method of claim 2, wherein activating the standby mode comprises at least one of:
    (i) turning OFF a system clock; and
    (ii) disabling any data input to the target circuit.

4. The method of claim 1, further comprising:
    measuring a standby current of a second number of circuit blocks of the target circuit;
    comparing the measured standby current of the second number of circuit blocks to a second baseline standby current of the second number of circuit blocks; and
    upon determining that the measured standby current of the second number of circuit blocks is above a second predetermined factor of the second baseline standby current, identifying the second number of circuit blocks to have a time dependent dielectric breakdown (TDDB) degradation concern, wherein the second predetermined factor is >1.

5. The method of claim 4, further comprising:
    measuring a noise of the standby current of the second number of circuit blocks;
    comparing the measured noise of the standby current of the second number of circuit blocks to a predetermined threshold; and
    upon determining that the measured noise of the standby current of the second number or circuit blocks is above the predetermined threshold, identifying the second number of circuit blocks to have the time dependent dielectric breakdown (TDDB) degradation concern.

6. The method of claim 5, further comprising:
    upon identifying that the first number of circuit blocks has the BTI degradation concern, imposing one or more restrictions on the first number of circuit blocks to prevent a premature failure of the first number of circuit blocks; and
    upon identifying that the second number of circuit blocks has the TDDB degradation concern, imposing one or more restrictions on the second number of circuit blocks to prevent a premature failure of the second number of circuit blocks.

7. The method of claim 4, wherein a number of circuit blocks that are included in the second number of circuit blocks is based on maintaining a total standby current consumption of the second number of circuit blocks below a predetermined ratio of the total standby current consumption to a target current measurement sensitivity.

8. The method of claim 7, wherein the predetermined ratio of the total standby current consumption to the target current measurement sensitivity is at most 100:1.

9. The method of claim 4, wherein a number of circuit blocks that are included in the first number of circuit blocks is larger than a number of circuit blocks that are included in the second number of circuit blocks.

10. The method of claim 1, further comprising comparing a signature of a current consumption over a predetermined time period of the first number of circuit blocks to a stored aging model of the first number of circuit blocks to identify an effective age of the first number of circuit blocks.

11. The method of claim 10, further comprising adjusting the stored aging model of the first number of circuit blocks based on a deviation between the signature of the current consumption over the predetermined time period of the first number of circuit blocks and the stored aging model of the first number of circuit blocks.

12. A method of monitoring an effective age of a target circuit by a monitor circuit, the method comprising:
    activating a standby mode in the target circuit;
    measuring a standby current of a second number of circuit blocks of the target circuit by the monitor circuit;
    comparing the measured standby current of the second number of circuit blocks to a second baseline standby current of the second number of circuit blocks;
    measuring a noise of the standby current of the second number of circuit blocks; and
    upon determining that at least one of: (i) the measured standby current of the second number of circuit blocks is above a second predetermined factor of the second baseline standby current, wherein the second predetermined factor is >1, and (ii) the measured noise of the standby current of the second number or circuit blocks is above a predetermined threshold, identifying the second number of circuit blocks to have a time dependent dielectric breakdown (TDDB) degradation concern,
    wherein a number of circuit blocks that are included in the second number of circuit blocks is based on a predetermined current measurement sensitivity.

13. The method of claim 12, wherein the standby mode is activated in the second number of circuit blocks of the target circuit.

14. The method of claim 13, wherein activating the standby mode comprises at least one of:
(iii) turning OFF a system clock; and
(iv) disabling any data input to the target circuit.

15. The method of claim 12, further comprising:
measuring a standby current of a first number of circuit blocks of the target circuit;
comparing the measured standby current of the first number of circuit blocks to a first baseline standby current of the first number of circuit blocks; and
upon determining that the measured standby current of a first number of circuit blocks is below a first predetermined factor of the first baseline standby current of the first number of circuit blocks, identifying the first number of circuit blocks to have a bias temperature instability (BTI) degradation concern, wherein the first predetermined factor is <1.

16. The method of claim 15, further comprising:
upon identifying that the first number of circuit blocks has the BTI degradation concern, imposing one or more restrictions on the first number of circuit blocks to prevent a premature failure of the first number of circuit blocks; and
upon identifying that the second number of circuit blocks has the TDDB degradation concern, imposing one or more restrictions on the second number of circuit blocks to prevent a premature failure of the second number of circuit blocks.

17. The method of claim 12, wherein a number of circuit blocks that are included in the second number of circuit blocks is based on maintaining a total standby current consumption of the second number of circuit blocks below a predetermined ratio of the total standby current consumption to a target current measurement sensitivity.

18. The method of claim 17, wherein the predetermined ratio of the total standby current consumption to the target current measurement sensitivity is at most 100:1.

19. An age monitor circuit comprising:
a controller circuit coupled to a target circuit and configured to activate a standby mode in the target circuit;
a test circuit coupled to the controller circuit;
a register circuit coupled to the test circuit; and
a predictor circuit coupled to the register circuit, wherein:
the controller circuit is configured to activate a standby mode in the target circuit and select a first number of circuit blocks of the target circuit; and
the test circuit is configured to:
measure a standby current of the first number of circuit blocks; and
store the measured standby current in the register circuit; and
the predictor circuit is configured to:
compare the measured standby current of the first number of circuit blocks to a first baseline standby current of the first number of circuit blocks provided by the register circuit; and
upon determining that the measured standby current of the first number of circuit blocks is below a first predetermined factor of a baseline standby current of the first number of circuit blocks, identify the first number of circuit blocks to have a bias temperature instability (BTI) degradation concern, wherein the first predetermined factor is <1, wherein a number of circuit blocks that are included in the first number of circuit blocks is based on a predetermined current measurement sensitivity.

20. The age monitor circuit of claim 19, wherein:
the test circuit is further configured to:
measure a standby current of a second number of circuit blocks of the target circuit; and
measure a noise of the standby current of the second number of circuit blocks; and
the predictor circuit is configured to:
compare the measured standby current of the second number of circuit blocks to a second baseline standby current of the second number of circuit blocks provided by the register circuit; and
upon determining that at least one of: (i) the measured standby current of the second number of circuit blocks is above a second predetermined factor of the second baseline standby current, wherein the second predetermined factor is >1, and (ii) the measured noise of the standby current of the second number or circuit blocks is above a predetermined threshold, identify the second number of circuit blocks to have a time dependent dielectric breakdown (TDDB) degradation concern.

* * * * *